(12) United States Patent
Ruha et al.

(10) Patent No.: US 6,473,019 B1
(45) Date of Patent: Oct. 29, 2002

(54) LOW CAPACITANCE, LOW KICKBACK NOISE INPUT STAGE OF A MULTI-LEVEL QUANTIZER WITH DITHERING AND MULTI-THRESHOLD GENERATION FOR A MULTI-BIT SIGMA-DELTA MODULATOR

(75) Inventors: Antti Ruha, Oulu (FI); Tarmo Ruotsalainen, Oulu (FI); Jussi-Pekka Tervaluoto, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/886,412

(22) Filed: Jun. 21, 2001

(51) Int. Cl.[7] .............................................. H03M 3/00
(52) U.S. Cl. ...................................... 341/143; 341/200
(58) Field of Search ................................. 341/143, 200, 341/155

(56) References Cited

U.S. PATENT DOCUMENTS

| | | | |
|---|---|---|---|
| 5,260,901 A | * 11/1993 | Nagase et al. | 365/189.01 |
| 5,305,004 A | 4/1994 | Fattaruso | 341/120 |
| 5,323,158 A | * 6/1994 | Ferguson, Jr. | 341/143 |
| 5,406,283 A | 4/1995 | Leung | 341/143 |
| 5,801,657 A | * 9/1998 | Fowler et al. | 341/155 |
| 5,864,312 A | * 1/1999 | Shou et al. | 341/200 |
| 5,889,482 A | 3/1999 | Zarubinsky et al. | 341/131 |
| 5,990,819 A | 11/1999 | Fujimori | 341/150 |
| 6,011,501 A | 1/2000 | Gong et al. | 341/150 |
| 6,087,969 A | 7/2000 | Stockstad et al. | 341/143 |
| 6,304,608 B1 | * 10/2001 | Chen et al. | 341/143 |
| 6,326,911 B1 | 12/2001 | Gomez et al. | 341/143 |

FOREIGN PATENT DOCUMENTS

| | | |
|---|---|---|
| WO | WO 98/44626 | 10/1998 |

OTHER PUBLICATIONS

Multibit Σ–Δ A/D Converter Incorporating A Novel Class of Dynamic Element Matching Techniques; Leung, Bosco H et al; IEEE Transactions on Circuits and Systems II Analog and Digital Signal Processing, vol. 39 No. 1; Jan. 1992.

(List continued on next page.)

*Primary Examiner*—Peguy Jeanpierre
*Assistant Examiner*—Jean Bruner Jeanglaude
(74) *Attorney, Agent, or Firm*—Harrington & Smith LLP

(57) ABSTRACT

An N-level quantizer circuit has an analog input terminal and N−1 digital output terminals, and includes a sampling circuit coupled to the input terminal for providing a sampled input voltage signal; at least one preamplifier stage for converting the sampled input voltage signal to a current signal and providing an amplified sampled input signal; and N−1 comparator stages each having an input coupled to an output of the at least one preamplifier stage and sharing the input current equally. Individual ones of the N−1 comparator stages operate to compare the amplified sampled signal to an associated one of N−1 reference signals. The quantizer further includes N−1 latches, individual ones of which latch an output state of one of the N−1 comparators and have an output coupled to one of the N−1 digital output terminals of the quantizer circuit. Individual ones of the N−1 comparators are constructed using a plurality of common gate configured transistors for suppressing a feedback of noise from the N−1 latches to others of the comparators and to the input terminal of the quantizer circuit. In one embodiment the use of a common preamplifier stage also serves to reduce the input capacitance of the quantizer, thereby reducing the capacitive load seen by the output amplifier, which may be an integrator, of the loop filter. The quantizer further includes a dither signal generator having an output coupled to the output of the at least one preamplifier stage, and a threshold signal generator outputting the N−1 reference signals. The threshold signal generator may be simply constituted using a string of series coupled resistances connected between positive and negative reference voltages, or a transconductor feeding scaled current mirrors can be employed.

20 Claims, 15 Drawing Sheets

OTHER PUBLICATIONS

Linearity Enhancement of Multibit ΔΣ A/D and D/A Converters Using Data Weighted Averaging; Baird, Rex T. et al; IEEE Transactions on Circuits and Systems II Analog and Digital Signal Processing, vol. 42 No. 12; Dec. 1995.

A Noise–Shaping Coder Topology for 15+ Bit Converters; Carley, L. Richard; IEEE Journal of Solid–State Circuits, vol. 24, No. 2; Apr. 1989.

* cited by examiner

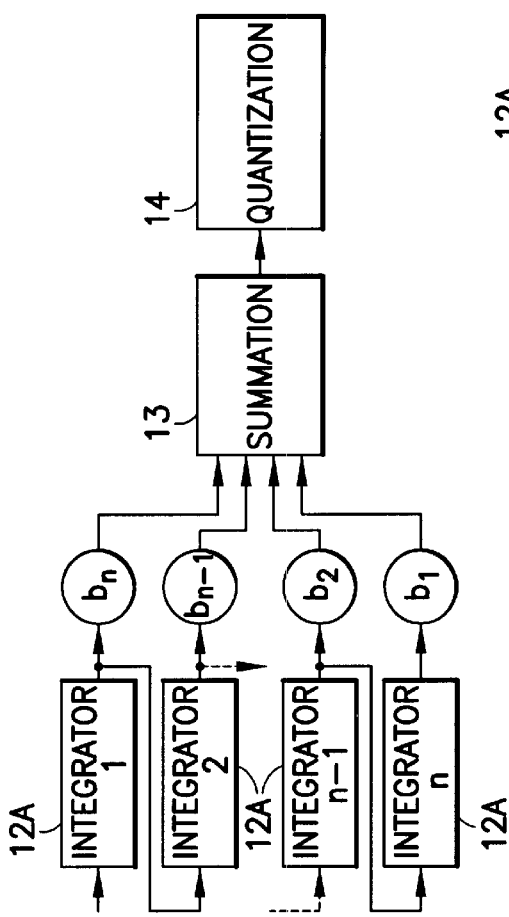
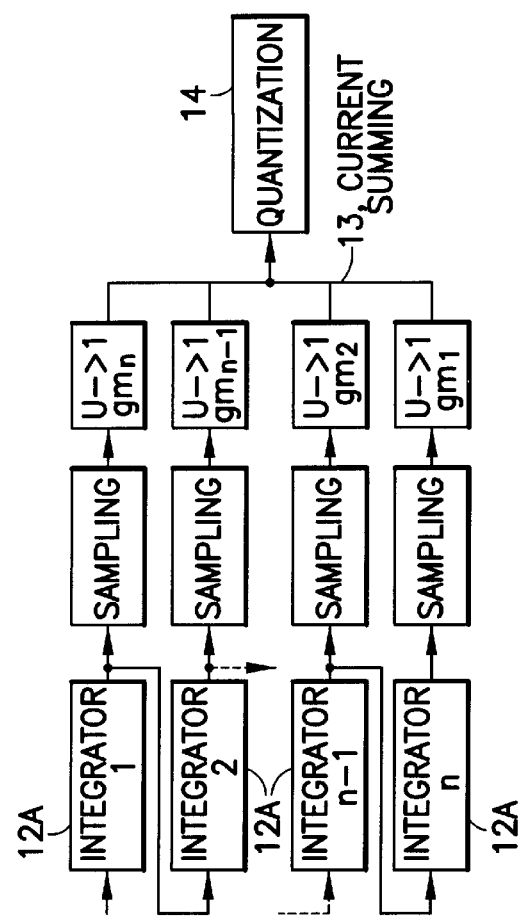
FIG.7B-1
FIG.7B-2
| FIG.7B-1 | FIG.7B-3 |
| --- | --- |
| FIG.7B-2 | |
FIG.7B

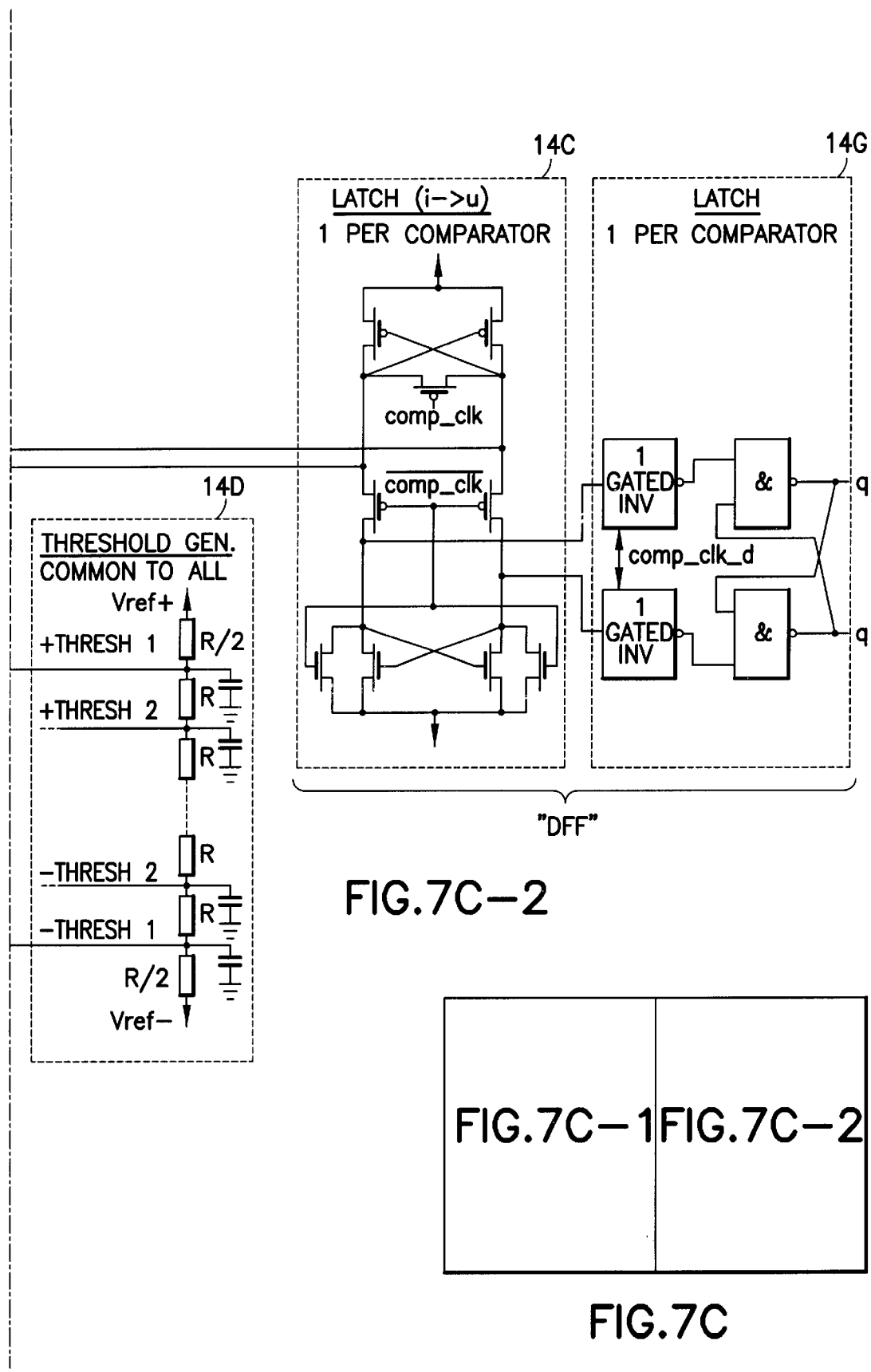

US 6,473,019 B1

LOW CAPACITANCE, LOW KICKBACK NOISE INPUT STAGE OF A MULTI-LEVEL QUANTIZER WITH DITHERING AND MULTI-THRESHOLD GENERATION FOR A MULTI-BIT SIGMA-DELTA MODULATOR

FIELD OF THE INVENTION

This invention relates generally to sigma-delta (SD) modulators and, more specifically, to N-level quantizers used in multi-bit SD modulators.

BACKGROUND OF THE INVENTION

SD modulators used in analog-to-digital converters (ADCs) and other applications are well known in the art. Reference may be had, by example, to S. R. Norsworthy et al., "Delta-Sigma Data Converters", IEEE Press, NY, 1997, and to J. G. Proakis et al., "Digital Signal Processing" Third Edition, Prentice-Hall, 1996. A typical embodiment of a SD modulator includes a loop filter followed by quantizer, and a digital-to-analog converter (DAC) in the feedback path.

In a SD modulator that outputs multiple bits (multi-bit) the output signal of the loop filter is quantized with a multi-bit quantizer. For example, in a four bit SD modulator the output of the loop filter is quantized into 16 levels. However, quantization into N (e.g.,16) levels requires the presence of N−1 or 15 comparators. As may be appreciated, the use of this many comparators can cause a number of problems. For example, the switching operation of a comparator and/or the operation of a clocked or dynamic output latch can result in the generation of kickback noise, thereby reducing accuracy and also disturbing other circuitry, such as the other comparators and the circuitry that generates the multiple threshold voltages used in the multi-bit quantizer. Also, the input capacitance of the comparators loads the output of the last amplifier in the loop filter, and thus increases its current consumption. Note that relatively large input transistors are typically used in multi-level quantizers to achieve a low offset, as opposed to the relatively simple comparators used in single-bit sigma-delta modulators. Furthermore, the comparators themselves may consume a significant amount of current, as well as integrated circuit area. Note as well that in multi-bit quantizers a continuous time preamplifier is often used to achieve a low offset value, as opposed to a simple, low current drain dynamic latch as is typically found in single-bit quantizers.

A need therefore exists to provide an improved multi-bit sigma-delta modulator, such as a switched capacitor (SC) multi-bit SD modulator, as well as a continuous time multi-bit SD modulator, having an improved quantizer that exhibits a reduced generation of kickback noise, input capacitance and power consumption.

SUMMARY OF THE INVENTION

The foregoing and other problems are overcome by methods and apparatus in accordance with embodiments of these teachings.

These teachings provide embodiments of an N-level quantizer for use in an n-order sigma-delta modulator (SDM), wherein the coupling of kickback noise into other circuitry and the input capacitance are both reduced. The reduction in the kickback noise has the beneficial effect of enhancing the dynamic range of the SDM by reducing disturbances and quantization error. The reduced input capacitance of the quantizer reduces power consumption, as the load of the last amplifier of the loop filter is reduced and, thus, the amplifier can be designed to operate with reduced bias currents. A further benefit of these teachings is that the kickback noise is also reduced in the circuitry that generates the required multiple comparator threshold voltages or currents used in the multi-level quantization, thereby enabling simpler and lower power circuits to be employed as compared to conventional approaches, such as switched capacitor circuits used to sample the threshold. In addition, the disclosed circuitry enables a dither signal to be added in a simple manner, thereby reducing the generation of unwanted tones for low input signal levels and improving the dynamic range of the SDM.

An N-level quantizer circuit that is provided in accordance with these teachings has an analog input terminal and N−1 digital output terminals, and includes a sampling circuit coupled to the input terminal for providing a sampled input signal; at least one preamplifier stage for converting the sampled voltage input signal to a current signal and providing an amplified sampled input signal; and N−1 comparator stages each having an input coupled to an output of the common preamplifier stage. Individual ones of the N−1 comparator stages operate to compare the amplified sampled input signal to an associated one of N−1 reference signals. The quantizer further includes N−1 latches, individual ones of which latch an output state of one of the N−1 comparators and have an output coupled to one of the N−1 digital output terminals of the quantizer circuit. Individual ones of the N−1 comparators are constructed using a plurality of common gate configured transistors for suppressing a feedback of noise from the N−1 latches to others of the comparators and to the input terminal of the quantizer circuit. The use of the common preamplifier stage also serves to reduce the input capacitance of the quantizer, thereby reducing the capacitive load seen by the output amplifier, which may be an integrator, of the loop filter.

For the purposes of these teachings the output latch may be considered to be an integral part of a comparator, as the latch performs the actual conversion from the analog signal presentation to the digital signal presentation, with the aid of positive feedback. As such, one may consider that a comparator in this context is formed by two common gate current buffers, one for the input signal and the other for the reference signal, and the latch(es) in the output.

The quantizer further includes a dither signal generator having an output coupled to the output of the common preamplifier stage, and a threshold signal generator outputting the N−1 reference signals. The threshold signal generator may be simply constituted using a string of series coupled resistances connected between positive and negative reference voltages.

The disclosed quantizer circuitry may be extended to support a sigma-delta modulator topology with a chain of integrators with weighted forward summation. In this structure the outputs of all of the integrators are first summed in a summer, the output of which is then fed to the quantizer. In the disclosed quantizer structure the summing can be readily implemented in the current mode by providing one linearized preamplifier per integrator, and by wiring the outputs of these preamplifiers together. The current mode dither signal can be connected to this same summing node. The summed current is then fed to the N−1 comparator stages.

The preamplifier stage(s) includes a first differential transistor pair that converts the sampled input voltage signal to a first current signal. Individual ones of the N−1 comparators include an input stage constructed to include first common gate configured transistors that operate to suppress the feedback of noise from the N−1 latches to the input terminal of the quantizer circuit. As all of the common gate transistors may have identical dimensions, and as they all have the same source and gate voltages, the currents through these transistors are equal. Therefore the current is equally divided between the N−1 comparator stages. Individual ones of the comparators also include a threshold input stage constructed using a second differential input transistor pair for converting an associated reference signal voltage to a second current, and to also include second common gate configured transistors operating to suppress the feedback of noise from the N−1 latches to the reference signal generator. The second current is coupled through the second common gate configured transistors and is summed at an output node of the comparator with the first current signal.

The N-level quantizer may form a part of a multi-bit, nth order sigma-delta modulator.

A method in accordance with these teachings for operating an N-level quantizer includes steps of: (a) sampling an input signal to provide a sampled input voltage signal; (b) preamplifying the sampled input voltage signal and outputting a first current signal representing a preamplified sampled input signal; (c) adding a dither current signal to the first current signal to generate a dithered first current signal; (d) coupling the dithered first current signal to an input terminal of individual ones of N−1 comparator stages wherein the current is equally divided between the N−1 comparator stages; (e) operating individual ones of the N−1 comparator stages to compare the dithered first current signal to an associated one of N−1 reference current signals; and (f) latching an output of each of the N−1 comparator stages with a dynamic latch; wherein individual ones of the N−1 comparators are constructed using a plurality of common gate configured transistors for suppressing a feedback of noise generated by the step of latching to others of the comparators and to an input terminal of the N-level quantizer.

When these teachings are extended to the case of the sigma-delta modulator topology having a chain of integrators with weighted forward summation, the method operates a combined summer/N-level quantizer by: (a) sampling the plurality of input signals to provide sampled input signals; (b) operating a plurality of preamplifiers for preamplifying the sampled input voltage signals and outputting the first current signals representing preamplified sampled input signals; (c) summing the first current signals by connecting together the outputs of the preamplifiers; (d) adding a dither current signal to the sum of the first current signals to generate a dithered sum of the first current signals; (e) coupling the dithered sum of the first current signals to an input terminals of individual ones of N−1 comparator stages, where the current is equally divided between the N−1 comparator stages; (f) operating individual ones of the N−1 comparator stages to compare the dithered sum of the first current signals to an associated one of N−1 reference current signals; and (g) latching an output of each of the N−1 comparator stages with a dynamic latch. In the preferred embodiment the individual ones of the N−1 comparators are constructed using a plurality of common gate configured transistors for suppressing a feedback of noise generated by the step of latching to others of the comparators, as well as to an input terminal of the N-level quantizer.

The step of adding the dither current signal to the first current signal includes a step of generating the dither signal to have pseudorandom fluctuations in amplitude, and a magnitude that varies inversely to the magnitude of the input signal.

BRIEF DESCRIPTION OF THE DRAWINGS

The above set forth and other features of these teachings are made more apparent in the ensuing Detailed Description of the Preferred Embodiments, when read in conjunction with the attached Drawings, wherein.

DETAILED DESCRIPTION OF THE PREFERRED EMBODIMENTS

Figure 1A:
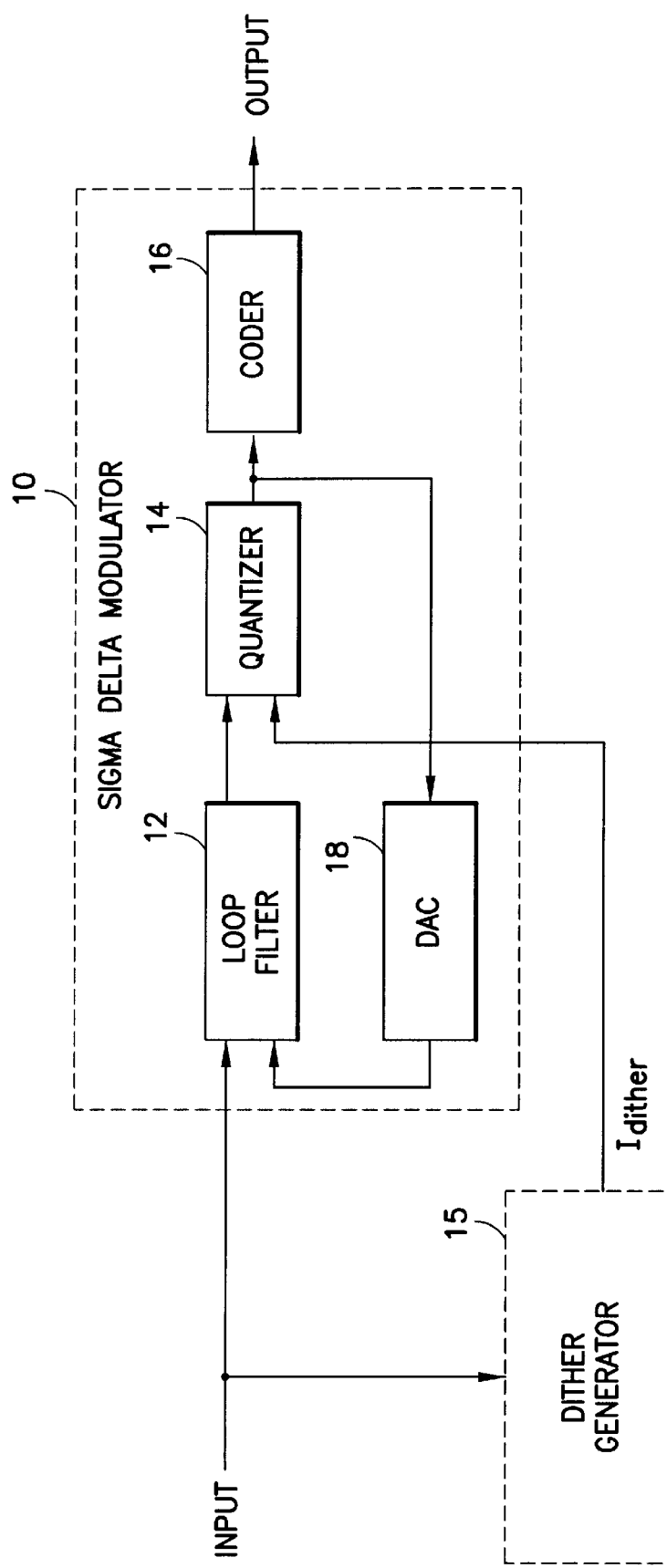
FIG. 1A is a simplified block diagram of a multi-bit SDM having a loop filter, an N-level quantizer, a DAC and a dither signal generator.
Figure 1B:
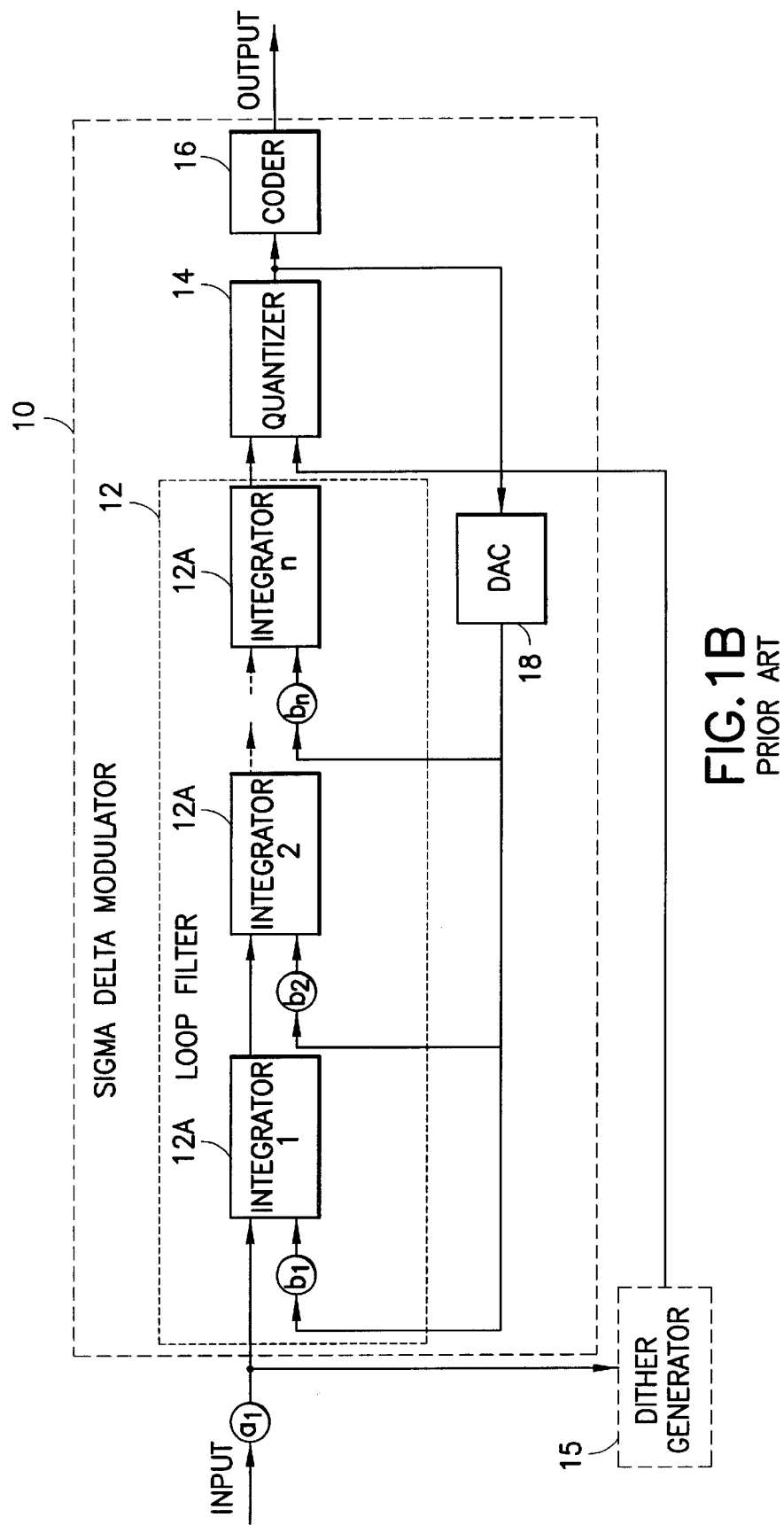
FIG. 1B illustrates a conventional structure of an nth order SD modulator, where the loop filter contains a chain of n integrators with distributed feedback (coefficients b1 to bn)

Referring to FIG. 1A, there is shown a simplified circuit block diagram of a multi-bit sigma-delta modulator (SDM) 10 that operates in accordance with these teachings. The SDM 10 includes an input node for receiving an analog input signal and an output node for outputting a multi-bit (k-bit) digital output signal. The input signal is applied to a loop filter 12, and from the output of the loop filter 12 to a quantizer 14. The input signal is also applied to a dither signal generator block 15 that includes an amplitude measurement block that outputs an amplitude control signal to a pseudorandom dither signal generation block (not shown).

Figure 8:
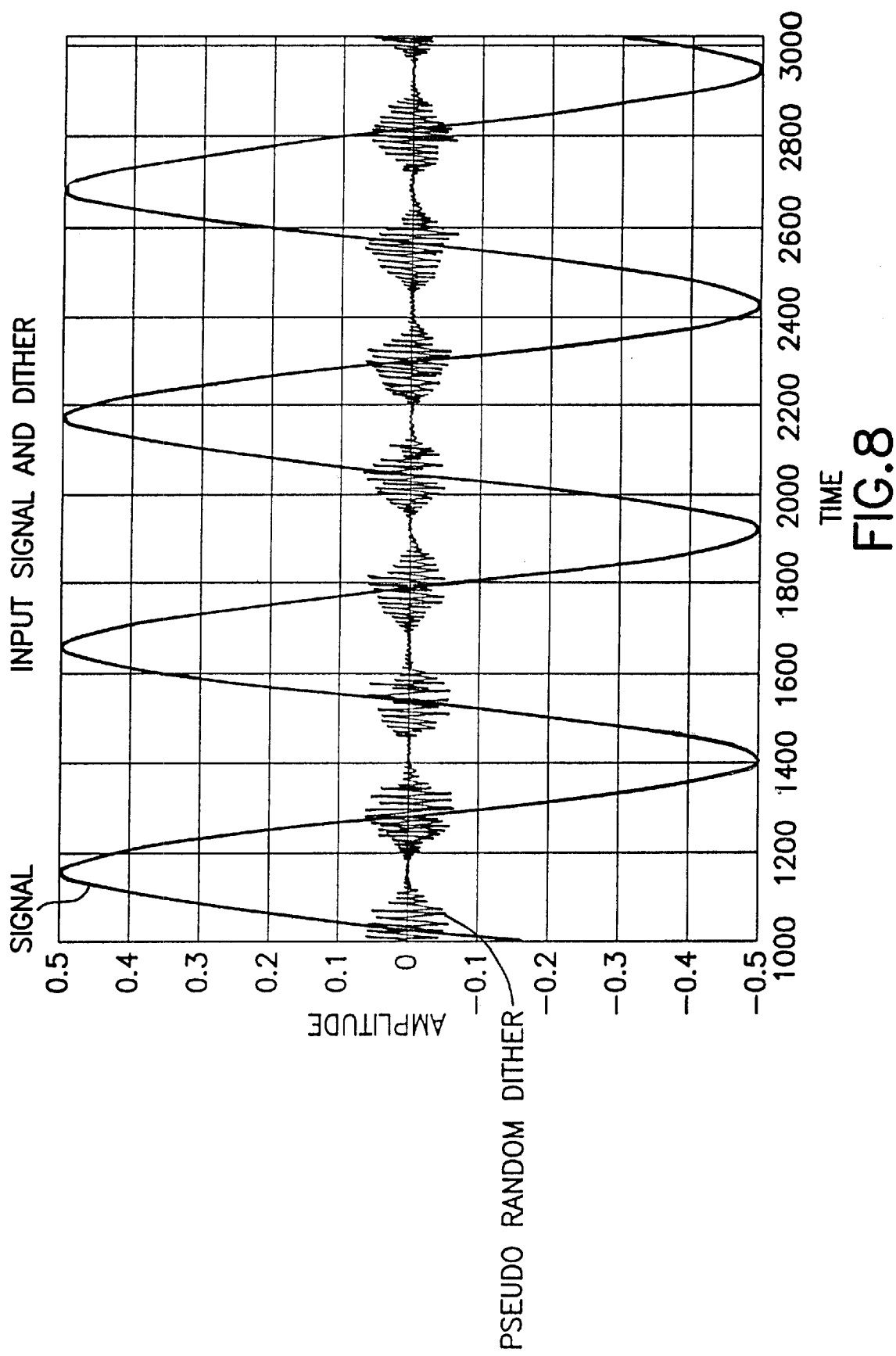
FIGS. 8 and 9 depict an exemplary pseudorandom dither signal and circuitry for generating the pseudorandom dither signal, respectively.
Figure 9:
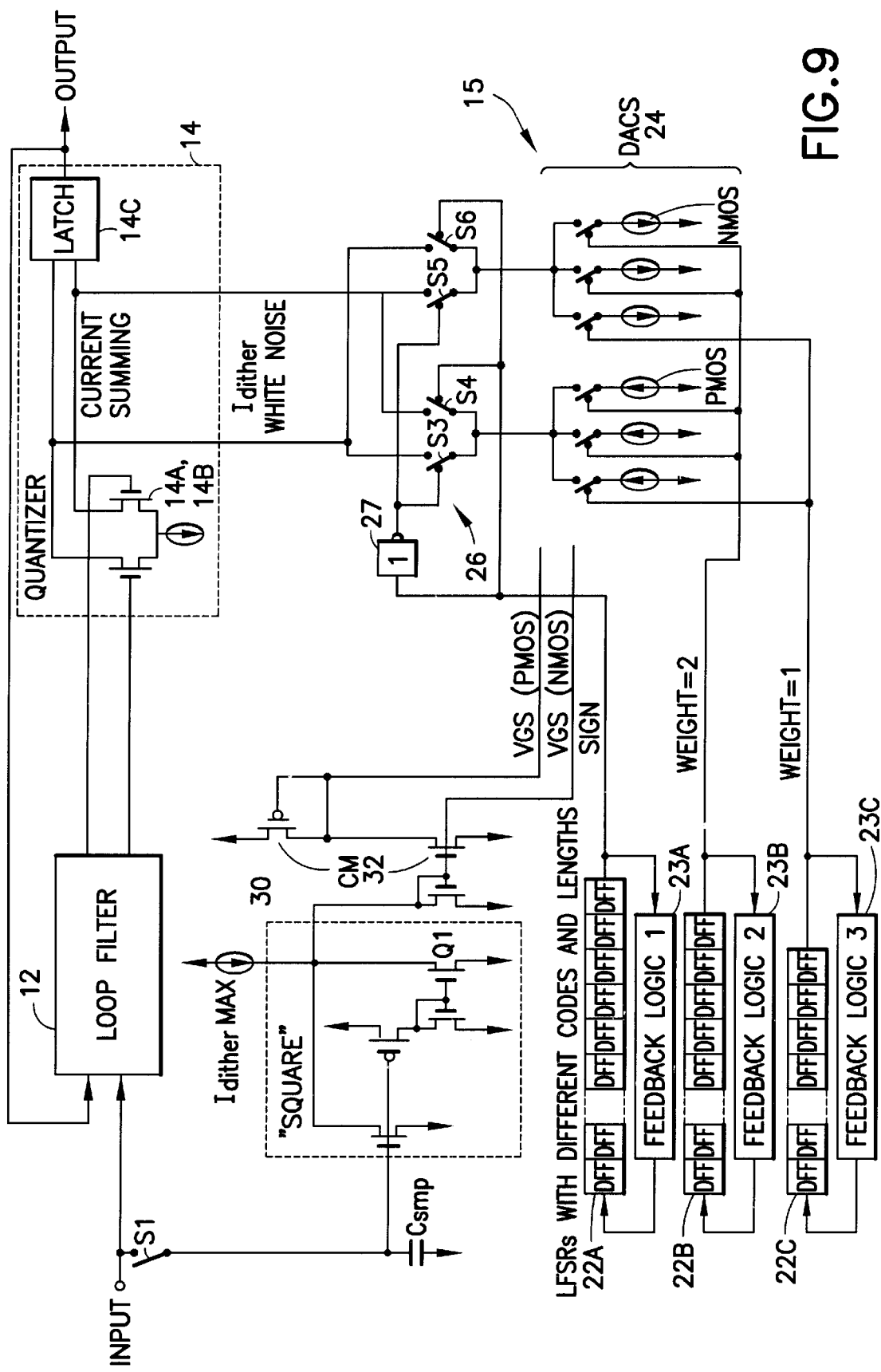

The output of the pseudorandom dither signal generation block is a dither signal, such as a dither current (Idither), that is applied as a second input to the quantizer 14. The effect is to add pseudorandom noise, i.e., a dither signal, at the input of the quantizer 14. The amplitude of the pseudorandom noise (Idither) is controlled in such a manner as to be inversely proportional to the amplitude of the input signal. That is, the amplitude of the dither signal is smallest when the amplitude of the input signal is largest and vice versa. The use of the dither signal is preferred as it reduces the generation of tones in the output signal of the SDM 10 when the input signal amplitude is small, and thereby also increases the dynamic range of the SDM 10. As a non-limiting example, the pseudorandom dither signal generation block may contain at least one linear feedback shift register (LFSR) operated in accordance with the output of the amplitude measurement block for controlling the on and off states of a plurality of transistors forming a current steering DAC, and hence the amplitude (and polarity) of the dither current signal. Reference can be had to FIGS. 8 and 9, described in further detail below, for depicting an exemplary pseudorandom dither signal and circuitry for generating the pseudorandom dither signal, respectively.

The output of the quantizer 14 is applied to a suitable coder 16 that outputs the multi-bit digital signal, and is also applied to a DAC 18 that forms a feedback path back to a second input of the loop filter 12.

Figures 2, 3:
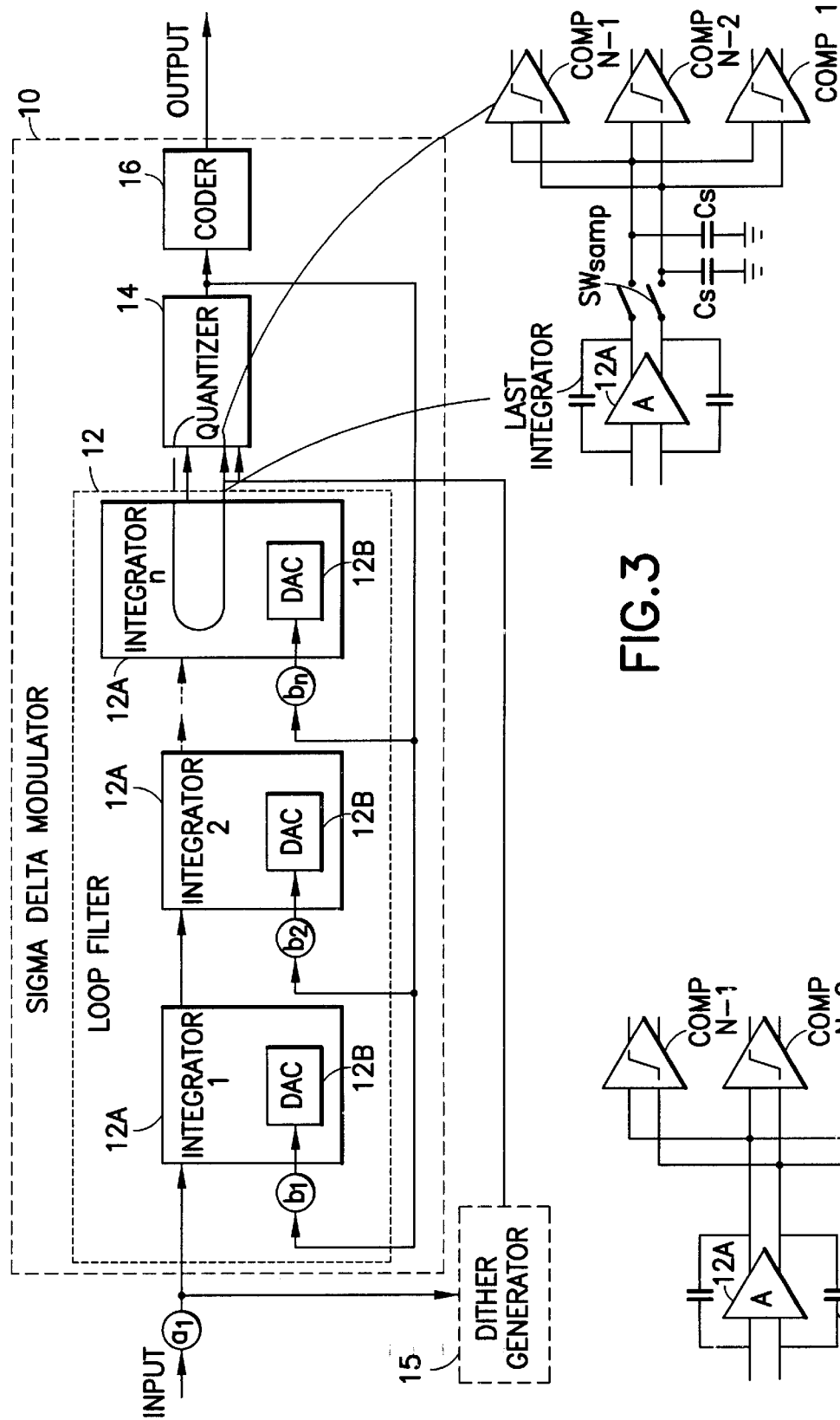
FIG. 2 shows a simplified conceptual circuit diagram of the N-level quantizer of FIG. 1A.
FIG. 3 shows a simplified conceptual circuit diagram of the N-level quantizer of FIG. 2 with the addition of input signal sampling, and with (optional) distributed feedback.

FIG. 2 shows a simplified conceptual circuit diagram of an embodiment of the N-level quantizer 14 of FIG. 1A. The quantizer 14 receives the output of a last amplifier, typically a last integrator 12A of n integrators, of the loop filter 12. The quantizer 14 contains N−1 comparators (comp 1 to comp N−1) connected in parallel for receiving the output of the last integrator 12A. Each comparator 1 through N−1 operates with a different threshold voltage, and changes its output state accordingly as the amplitude of the input signal from the amplifier 12A changes.

The embodiment of FIG. 2 exhibits a number of problems that it is a goal of these teachings to overcome. First, the comparators 1 through N−1 present a large capacitive load to the output of amplifier 12A, i.e., a capacitive load equal to (N−1) times $C_{in}$ of each comparator. Second, the kickback noise resulting from the change in state of each of the comparators 1 through N−1 disturbs the operation of the other comparators, and also feeds back directly to the output stage of amplifier 12A.

FIG. 3 is a simplified conceptual circuit diagram of the N-level quantizer of FIG. 2, with the addition of input signal sampling embodied as sampling switches $SW_{samp}$ and sampling capacitors $C_S$, and (optional) distributed feedback using multiple DACs 12B. In this embodiment the sampling switches $SW_{samp}$ are periodically closed to store the signal appearing at the output of the last integrator 12A onto the sampling capacitors $C_S$, and thus serves to reduce the kickback noise to the last integrator 12A of the loop filter 12. However, relatively large values of capacitance are required for $C_S$ to suppress the kickback noise, and furthermore the total capacitance seen by the output of the integrator 12A now becomes, during the time that the sampling switches are closed, equal to (N−1) times $C_{in}$ of the comparators, plus $C_S$.

As can be appreciated, neither one of the embodiments of FIGS. 2 or 3 is presently preferred for use in the multi-level SDM quantizer 14.

Figure 4:
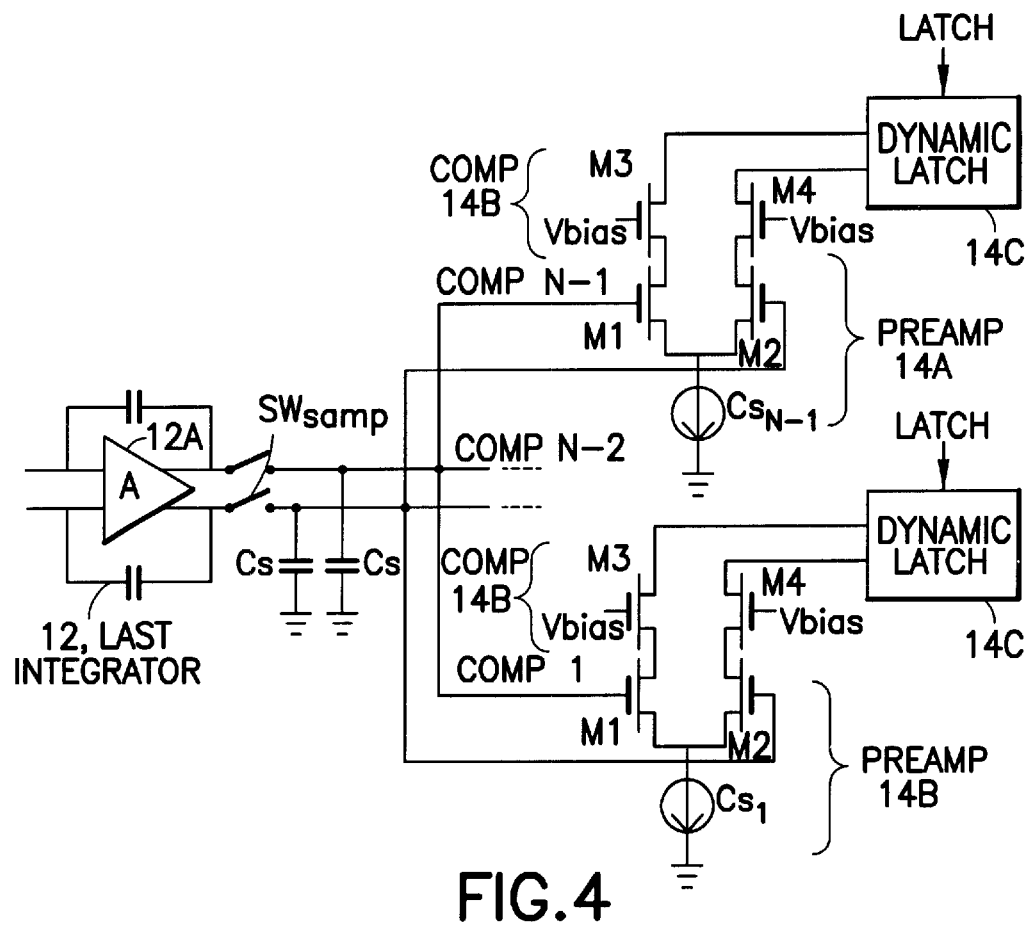
FIG. 4 shows a simplified circuit diagram of the N-level quantizer of FIG. 2 with the addition of input signal sampling, as in FIG. 3, and also a preamplifier with cascode transistors for each comparator.

FIG. 4 shows a circuit diagram of the N-level quantizer of FIG. 2, with the addition of the input signal sampling provided by sampling switches $SW_{samp}$ and sampling capacitors $C_S$, as in FIG. 3, and also a preamplifier 14A for each comparator 14B. The preamp/comparator is constructed with differential pair transistors M1 and M2, cascode transistors M3 and M4 and current sources $CS_1$ through $CS_{N-1}$. The quantizer 14 further includes dynamic latches 14C controlled by latching signals. An embodiment of the dynamic latches 14C is shown in FIG. 7C.

This embodiment improves on the embodiments of FIGS. 2 and 3, as it introduces less kickback noise to the integrator 12A, and also introduces less kickback noise from one comparator to another. Furthermore, the use of the preamplifiers 14A enables a smaller value of capacitance to be used for the sampling capacitors $C_S$, thereby reducing the total capacitive load seen by the output of the last loop filter integrator amplifier 12A.

Figure 5:
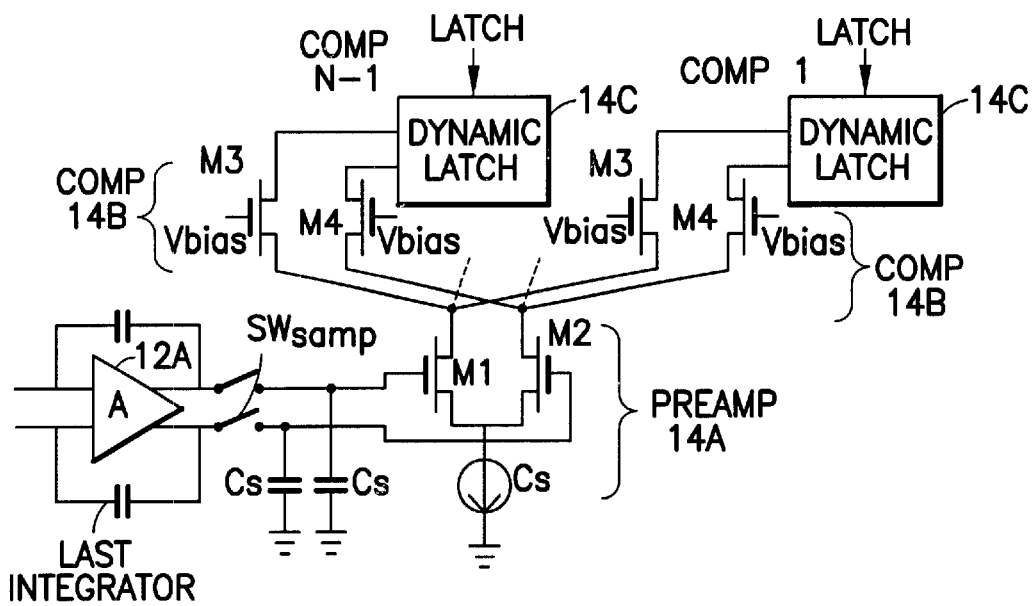
FIG. 5 shows a simplified circuit diagram of the N-level quantizer of FIG. 2 with input signal sampling, as in FIG. 3, and a common preamplifier for a plurality of current input comparators.

FIG. 5 is a circuit diagram of the N-level quantizer of FIG. 2, with the addition of the input signal sampling provided by sampling switches $SW_{samp}$ and sampling capacitors $C_S$, as in FIG. 3, and is a variation of the embodiment of FIG. 4. That is, there is provided only one common preamplifier 14A for each of the current input comparators 14B.

As with the embodiment of FIG. 4, this embodiment also introduces less kickback noise to the amplifier 12A, and introduces less kickback noise from one comparator to another. In addition, the single common preamplifier 14A presents a smaller capacitive load to the filter integrator amplifier 12A than do N−1 separate preamplifiers.

Figure 6:
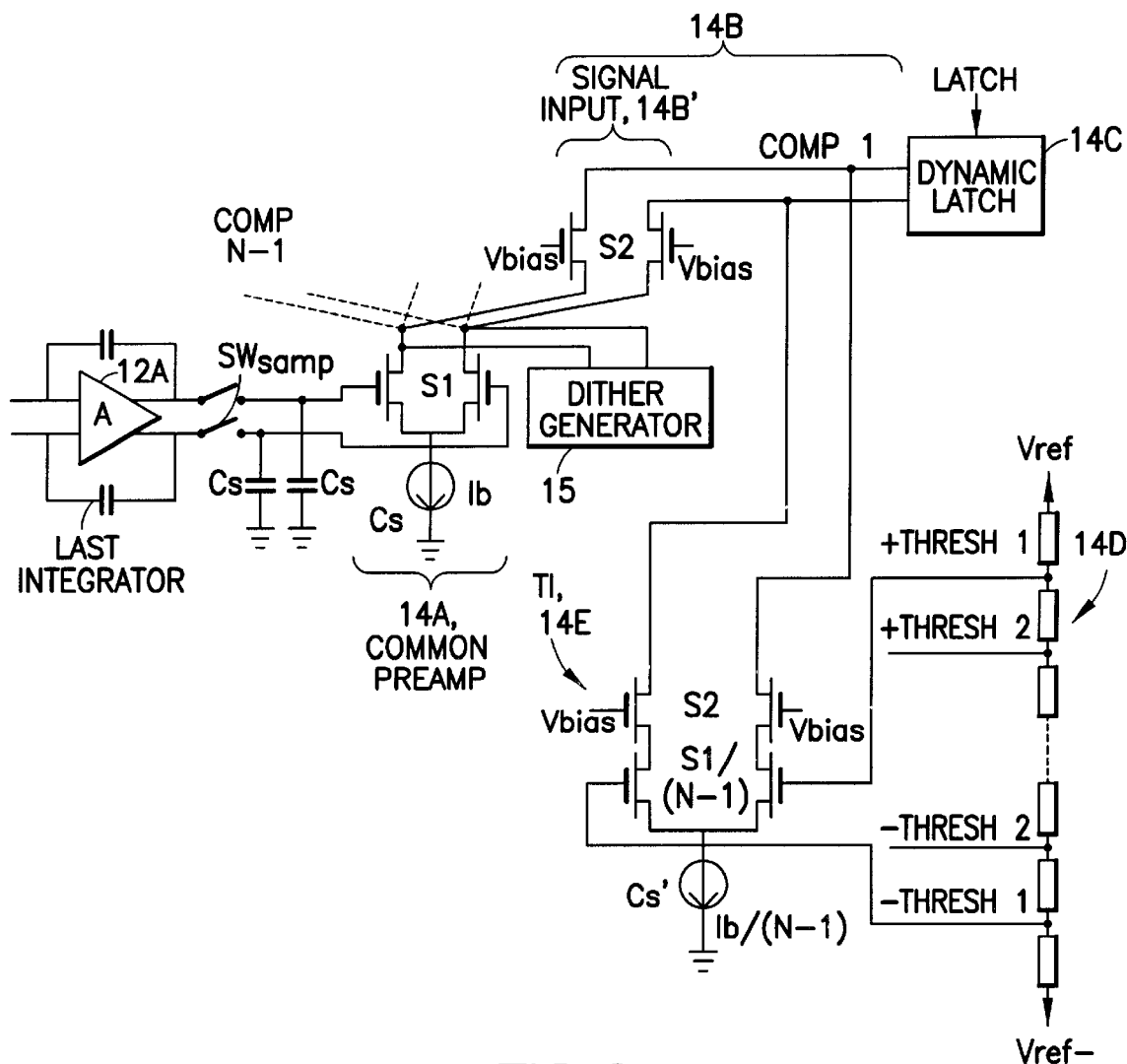
FIG. 6 shows a partial circuit diagram of the N-level quantizer of FIG. 2 with input signal sampling, as in FIG. 3, a common preamplifier for the plurality of current input comparators, dithering and a resistor string for generating comparator thresholds.

FIG. 6 shows a circuit diagram of the N-level quantizer of FIG. 1A with input signal sampling, as in FIG. 3, the common preamplifier 14A for the plurality of current input comparators 14B as in FIG. 5, the addition of the dither signal from the dither generator 15, and a reference current generator 14D comprised of a resistor string 14D', connected between potentials Vref+ and Vref−, for generating bipolar comparator threshold reference voltages thresh1, thresh2, . . . , threshN−1. FIG. 6 further shows one threshold input (TI) stage 14E (one per comparator), which converts the applied bipolar threshold voltages generated by resistor string 14D' to a current that is summed with the current output from the signal input block 14B'.

Figure 7A:
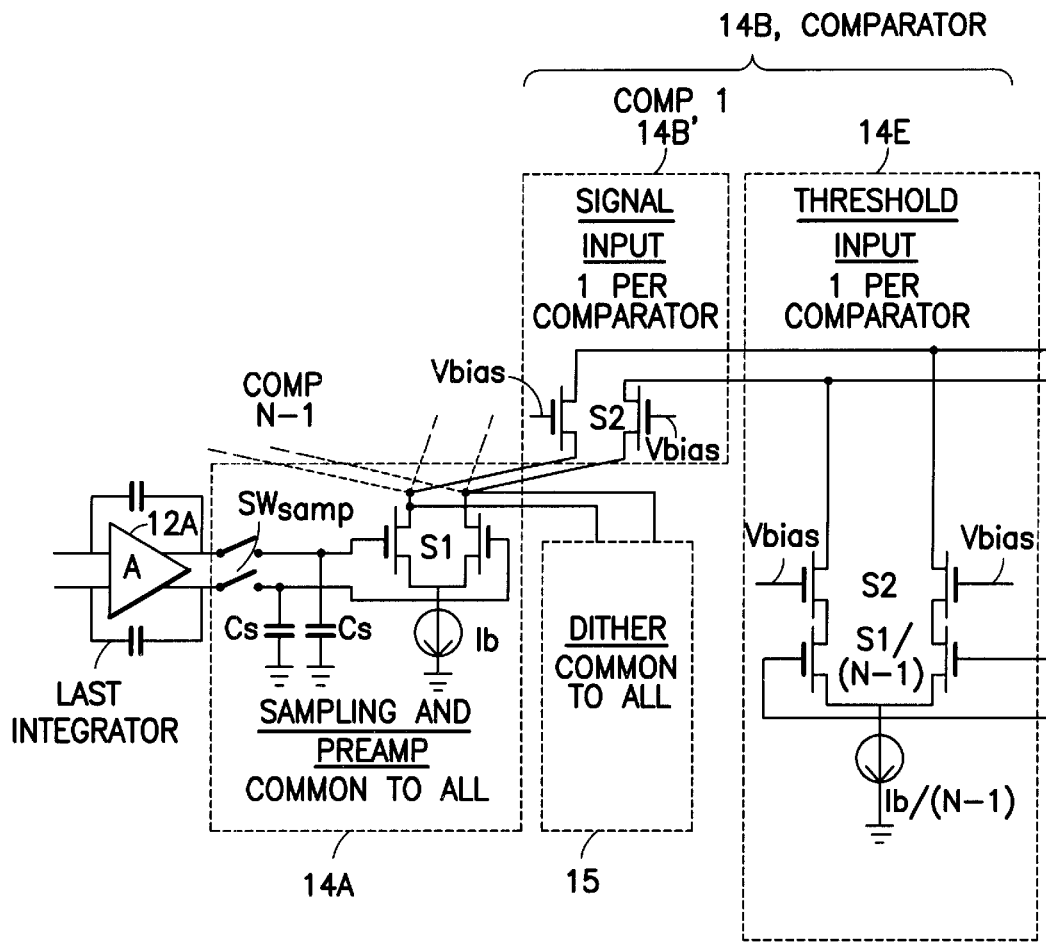
FIG. 7A is a complete circuit diagram of the N-level quantizer showing the structure of one comparator, in accordance with the embodiment of FIG. 6, as well as the common circuit blocks, and the construction of the dynamic latch, output latch and output buffer.
Figure 7A:
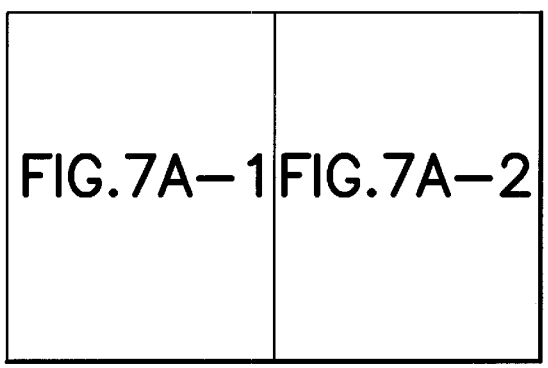
Figures 2, 7A:
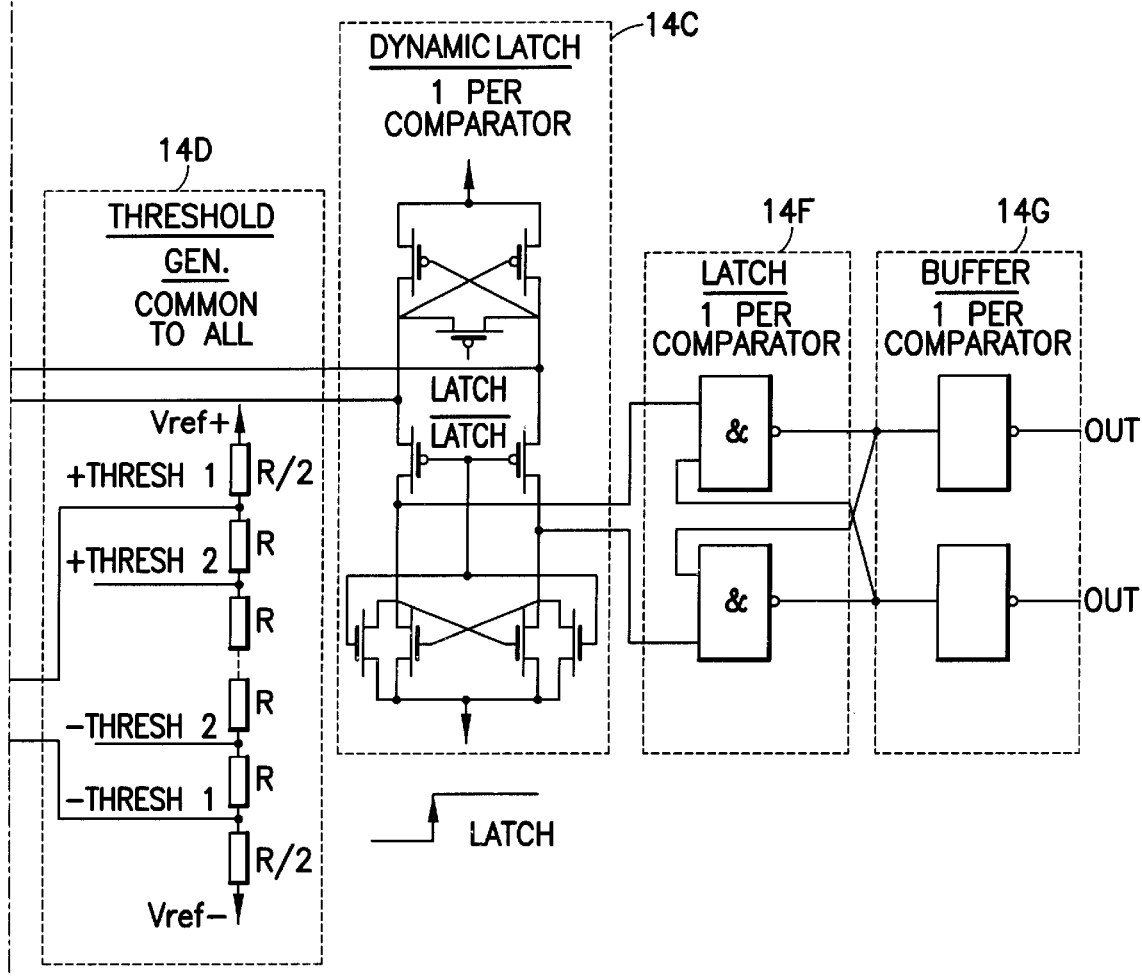
Figures 3, 7B:
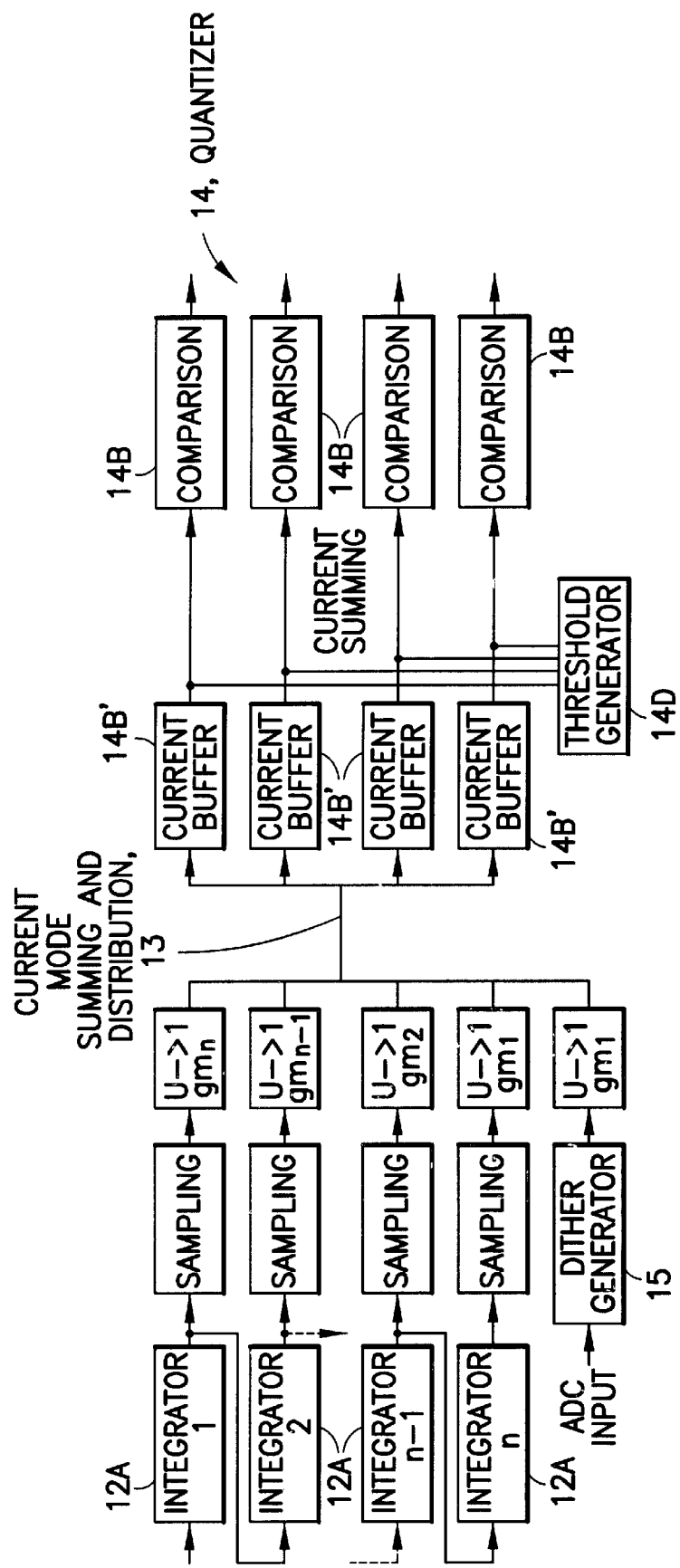
FIG. 7B, shown as FIGS. 7B-1, 7B-2 and 7B-3, illustrates the development of the combined summation and quantization of the SDM circuit structure shown in FIG. 1C.
Figures 1, 7C:
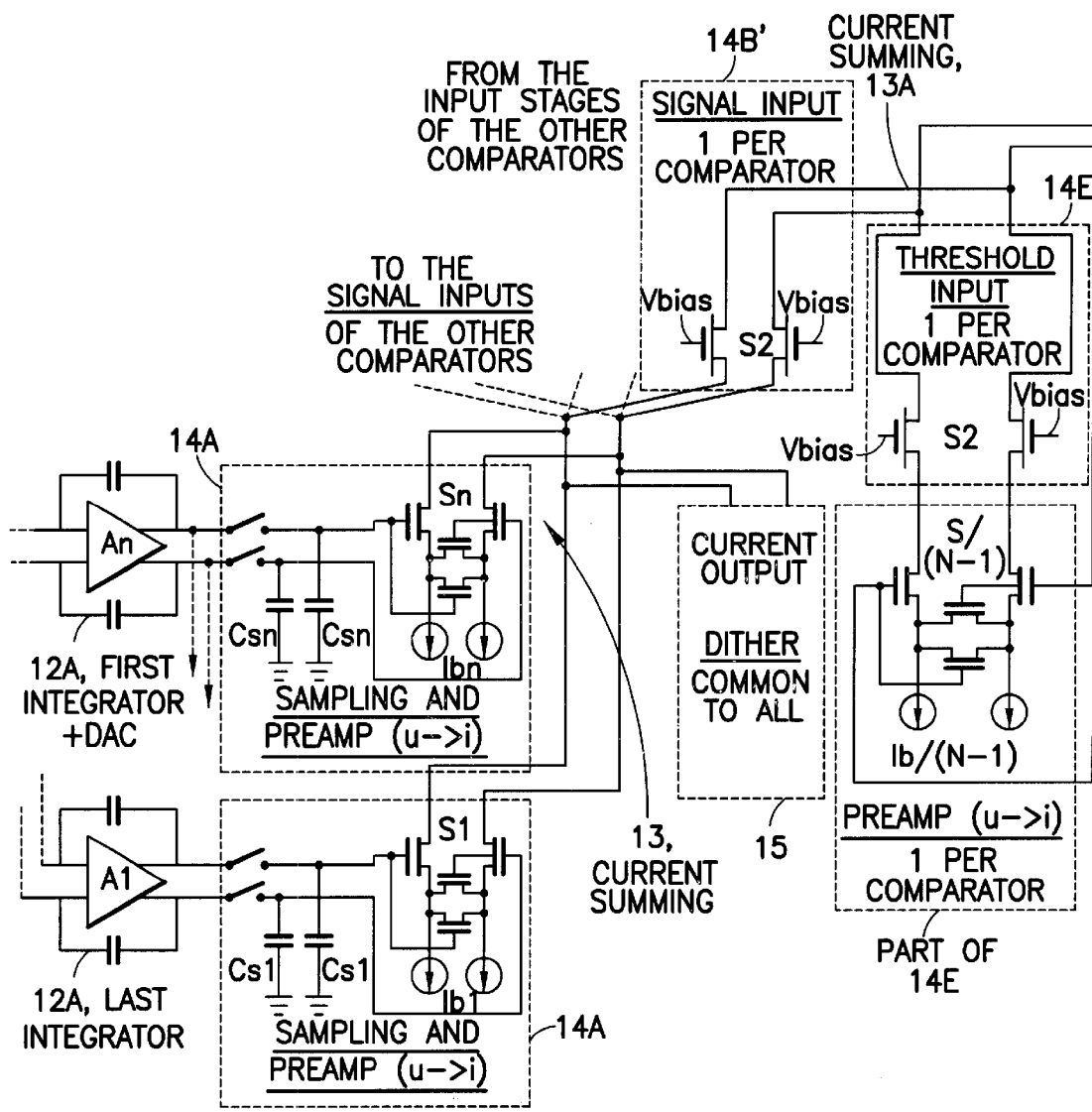
FIG. 7C shows an implementation of the multi-bit quantizer of FIG. 1C at the device level.
Figure 7D:
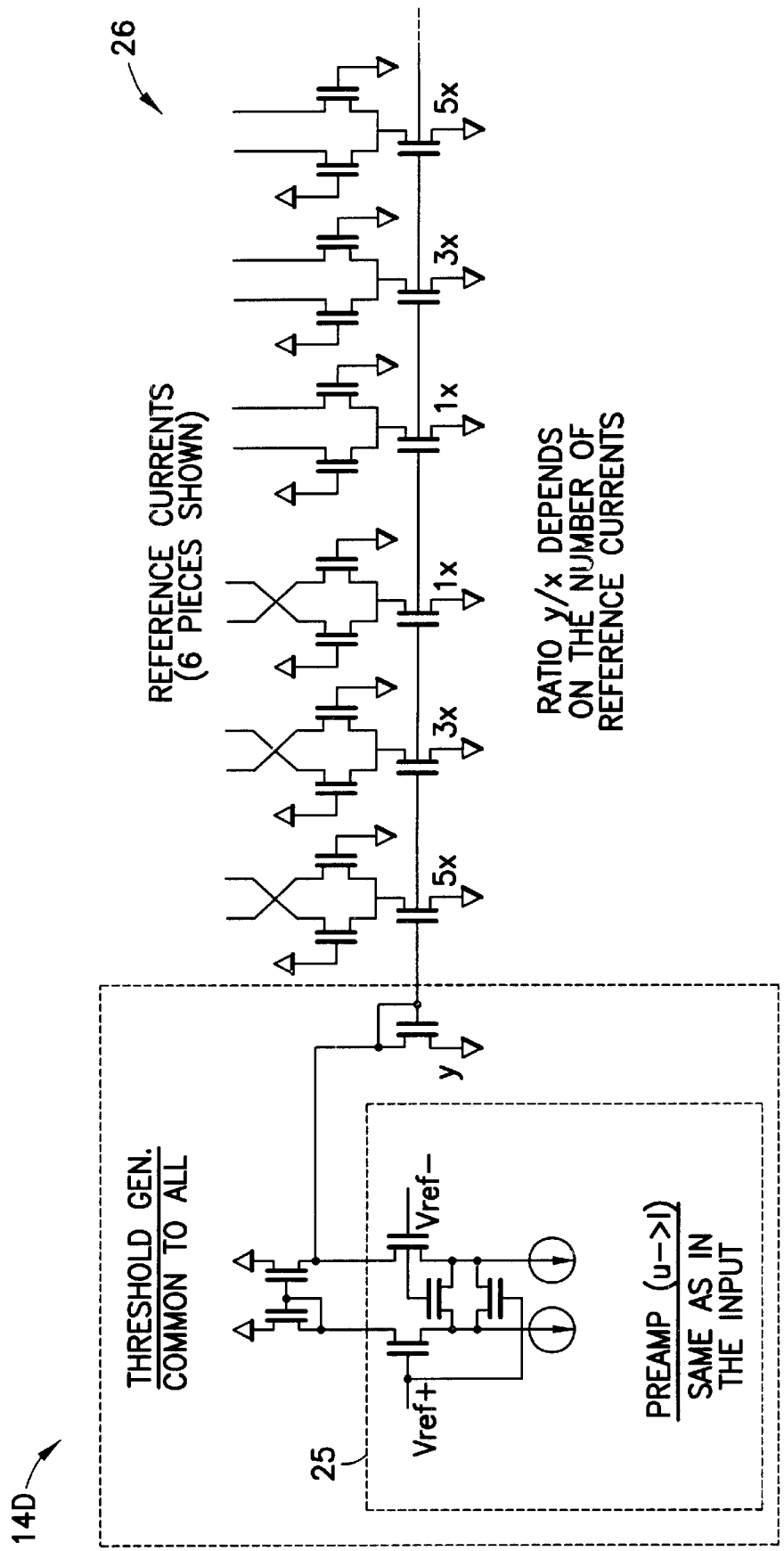
FIG. 7D shows an alternative embodiment of the reference current generator, where the reference current generator is constructed using a single linearized transconductor and multiple (e.g., six) scaled current mirrors.

FIG. 7D shows an alternative embodiment of the reference current generator 14D to generate the N−1 reference currents, wherein a single linearized transconductor 25 is used to create a single reference current, which is applied to scaled current mirrors 26 and thus mirrored with different scaling factors (e.g., X1, X3, X5) to the N−1 comparators 14B. In this embodiment the resistors 14D' are not required.

Note should be made that as all the common gate transistors at the input of the N−1 comparators 14B preferably have identical dimensions, and as they all have the same source and gate voltages, the currents of the common gate configured transistors are equal as well. Therefore, the dithered input current is equally divided between the N−1 comparator stages.

Note should also be made that the current source CS' of the TI stage 14E has a magnitude of Ib/(N−1), where Ib is the magnitude of the current sourced by the preamplifier 14A current source CS. Note also that one comparator 14B is actually constructed from the common gate configured signal input stage 14B' and the associated common gate configured TI stage 14E.

This embodiment, which employs the common gate transistors in the signal input stage 14B' and the threshold input stage 14E, similarly suppresses the introduction of kickback noise into the amplifier 12A and also suppresses the coupling of kickback noise from one comparator 14B to another, as it suppresses the introduction of kickback noise into the common threshold generator circuit 14D. In addition, the use of the preamplifiers 14A enables a smaller value to be used for the sampling capacitors $C_S$, thereby reducing the total capacitive load seen by the output of the last loop filter amplifier 12A. Also, the dither signal is simply added in common directly to the inputs of all of the comparators 14B. Due to the use of the cascode transistor structure there is little kickback noise introduced into the resistor string used to generate the threshold voltages, enabling the impedance of the resistor string 14D' to be made larger, thereby reducing power consumption.

The magnitude of the dither signal is preferably proportional to the magnitude of Ib of the current sources CS, and is inversely proportional to the number of quantization levels and to the square of the input signal magnitude. In this manner the undesirable generation of tones is suppressed.

FIG. 8 is exemplary of the pseudorandom dither signal and the relationship of its amplitude to the amplitude of, by example, a sinusoidal input signal.

FIG. 9 is a circuit diagram of one suitable embodiment of the dither generator 15, as disclosed in copending U.S. patent application Ser. No. 09/826,642, filed Apr. 5, 2001, entitled "Method and Apparatus for Providing Signal Dependent Dither Generator for Sigma-Delta Modulator", by the inventors of the subject matter of this patent application.

The dither generator 15 embodiment shown in FIG. 9 employs an input signal squaring and differencing circuit 30, and a chain of current mirrors (CMs) 32 providing current control over current steering DACs 24 to thereby modulate the amplitude of the dither current. The input signal for the dithering circuit 15 is sampled on Csmp. In order to avoid kickback noise the input signal sampling, controlled by switch S1, occurs at an instant in time when the SDM 10 is not sampling the input signal, i.e., the sampling of the input signal for the dither circuit is out of phase with the SDM sampling. The sampling for the dithering circuit does not need to be accurate, so the value of Csmp can be small. The square of the sampled amplitude of the input signal is generated with the squarer circuit 30. The squaring function is not required to be accurate, so a simple structure composed of small devices can be used. The output of the squarer circuitry is a current proportional to the square of the sampled amplitude of the input signal, plus some offset. The amount of offset is not critical, and can be minimized using well-known techniques if desired. The current representing the square of the input magnitude is subtracted from a constant predetermined current (IditherMAX) by Q1, and the resulting difference current is fed to the chain of current mirrors 32. The current mirrors 32, via signals Vgs(PMOS) and Vgs(NMOS), are used to control the current of the current sources of current steering DACs 24. As such, one output of the current mirrors 32 is the signal Vgs (gate to source voltage) for the PMOS current sources of the current steering DACs 24, while a second output of the current mirrors 32 is the signal Vgs for the NMOS current sources of the current steering DACs 24. Controlling the gate to source voltage of the PMOS and NMOS FETs that form the current sources of the current steering DACs 24 serves to control the amount of current that flows through these FETs, and making Vgs a function of the input signal magnitude controls the magnitude of the resulting dither current signal so as to be a function of the magnitude of the input signal, which is a desired result.

In this embodiment the value of the dither current signal is pseudorandom, as it is controlled by a plurality of LFSRs 22A, 22B, 22C and associated feedback logic 23A, 23B, 23C. The maximum amplitude of the dither current signal may assume any value within a predetermined continuous range of values, as it is controlled by the squaring-subtracting circuitry.

The LFSRs 22A, 22B, 22C generate a pseudorandom code. The longest LFSR 20A provides an output that (pseudorandomly) controls the sign (plus or minus) of the dither current by controlling the state of switches S3, S4, S5, S6, both directly and through the inverter driver 27. The second longest LFSR 22B is assigned a weight=2, and controls the state (on or off) of two PMOS current sources and two NMOS current sources. The third longest LFSR 22B is assigned a weight=1, and controls the state of one each of the PMOS and NMOS current sources.

In this manner, and while the current steering DACs 24 are being pseudorandomly switched in and out, and the sign of the resulting dither current is also being pseudorandomly selected, the squarer and differencing logic 30 and the current mirrors 32 operate to control the magnitude of the current that flows through the current steering DACs 24 in such a manner as to increase the current flow when the magnitude of the input signal decreases, and to decrease the current flow when the magnitude of the input signal increases. The result is the generation of an amplitude modulated dither current signal that resembles white noise (see FIG. 8), i.e., a dither signal that is ideally highly uncorrelated with the input signal to the SDM 10.

It should be noted that the particular embodiment of the dither signal generator 15 depicted in FIG. 9 is not to be construed as a limitation upon the practice of this invention, as other embodiments may be employed as well. Furthermore, in some applications the dither signal need not be pseudorandom in nature, and in some applications the use of the dither signal may not be required at all.

Returning now to the embodiment depicted in FIG. 6, it is noted that the transistor channel width/length ratio (denoted as aspect ratios S1 and S2 in FIG. 6) is preferably small enough to provide for linear operation over the entire quantization range. However, exact linearity is not required, since as the currents from two similar differential pairs are compared, only the matching of the aspect of ratios is important. Note that the aspect ratio of the preamplifier 14A differential transistor pair is denoted as S1, the aspect ratio of the T1 14E differential transistor pair is denoted as S2, and the aspect ratio of the differential transistor pair receiving the threshold voltage, for each comparator, has an aspect ratio denoted as $S1/(N-1)$, i.e., this aspect ratio, and the magnitude of the current output by current source CS', is scaled by the number of quantization levels (i.e., by the number of comparator stages).

FIG. 7A is a complete circuit diagram of the N-level quantizer 14 that depicts the structure of one comparator 14B, in accordance with the embodiment of FIG. 6, as well as the common circuit blocks, and also the construction of the dynamic latch 14C, an output (static) latch 14F and an output buffer 14G.

The operation of the circuit shown in FIG. 7A is as follows. The input signal to the quantizer 14 (the output signal of the last integrator amplifier 12A of the loop filter 12) is sampled by sampling switches $SW_{samp}$ onto sampling capacitors $C_S$. The differential pair preamplifier 14A converts the input voltage to a current. The output current from the dither generator 15 is added to the current generated by the preamplifier 14A. The resulting summation current is fed to the source terminals of the N−1 (N-level quantization)

common gate input transistors of the current buffer stage 14B'. These common gate transistors isolate the input stage of the quantizer 14 from the dynamic latches 14C of the second stage, thereby reducing kickback noise to the loop filter 12. The resistor string 14D' of the threshold generator 14D (or the transconductor 25 and current mirrors 26 of the embodiment of FIG. 7D) operates so as to produce (N−1)/2 evenly distributed voltages between positive and negative reference voltages. The differential transistor pair of the threshold input block 14E taps the appropriate pair of threshold voltages and converts these voltages to currents. These currents are fed to the source terminals of the common gate input transistors of the threshold input block 14E. These common gate transistors (aspect ratio S2) serve to isolate the reference current threshold generator 14D from the dynamic latches 14C, and thus operate to reduce the coupling of kickback noise into the reference current threshold generator 14D, The current appearing at the drain terminals of the common gate transistors of the signal input block 14B' and the current appearing at the drain terminals of the common gate transistors of the threshold input block 14E are summed and fed to the input of the dynamic latch 14C, which operates to latch the state of the inputs on the rising edge of the latch signal. Depending on the magnitude of the input signal from the loop filter 12, and the instantaneous magnitude of the dither current signal, the current appearing at the drain terminals of the common gate transistors of the signal input block 14B' will either be less than or greater than the current appearing at the drain terminals of the common gate transistors of the threshold input block 14E, which is set by the magnitude of the threshold voltage generated by the threshold generator 14D, thereby providing the comparator function. The NAND gates of the latch 14F and the inverters of the output buffer 14G amplify the output of the dynamic latch 14C. Additional NAND circuits may be used to provide a gating function if desired.

Figure 1C:
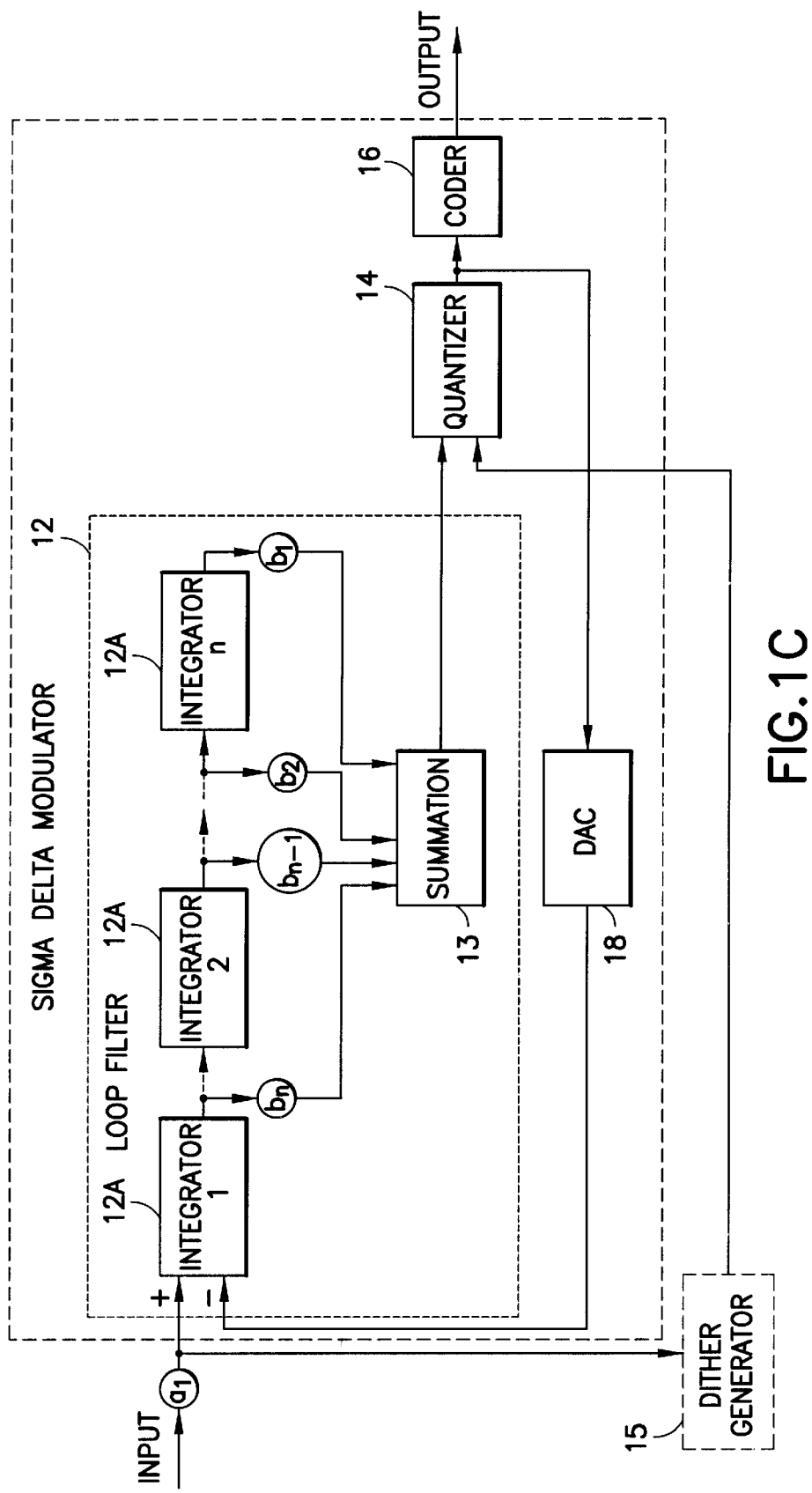
FIG. 1C shows an nth order SD modulator, wherein the loop filter contains a chain of n integrators with weighted forward summation (coefficients bn to b 1)

The disclosed quantizer can be extended to support a sigma-delta modulator structure with a chain of integrators 12A with weighted forward summation, as shown in FIG. 1C. In this structure the outputs of all the integrators are first summed in a summation block 13, the output of which is then fed to the quantizer 14. In the disclosed quantizer structure the summing can be readily implemented in the current mode by providing one linearized preamplifier 14A per integrator, and by wiring the outputs of these preamplifiers together. The current mode dither signal can be connected to this same summing node. The advantage of this embodiment is that the summer 13 and quantizer 14 can be merged, so as to achieve a compact and low power structure, and that the timing constraints imposed on the operation of the summing and quantization are eased. FIG. 7B, shown as FIGS. 7B-1, 7B-2 and 7B-3, illustrates the development of the combined summation and quantization of the SDM circuit structure shown in FIG 1C. FIG. 7B-1 shows the integrators 12A of the loop filter 12, coefficients bn to b1, summation block 13 and the quantizer 14. FIG. 7B-2 illustrates the manner in which the outputs of the integrators 12A are first sampled (to avoid the propagation of kickback noise from the quantizer 14 to the loop filter 12), converted to currents in transconductors (the transconductances $gm_n$ to $gm_1$ correspond to the coefficients bn to b1), summed 13 in the current mode and quantized in the current mode quantizer 14. FIG. 7B-3 shows the multi-bit quantizer 14 in more detail, as well as the addition of the dither signal in the common current summation node.

A block level structure and operation of this embodiment is depicted in further detail in FIG. 7C. The illustrated example is a multi-bit quantizer 14, which is the most general case, but the combination of the summation and quantization applies equally well to single-bit modulators. The output of each switched capacitor integrator 12A of the sigma-delta loop filter 12 is sampled to a simple sampling capacitor. For example, in a third order modulator there are three integrators 12A, so three different voltages are sampled. Sampling is used to avoid the propagation of kickback noise from the quantizer 14 to the loop filter 12. Each of the sampled voltages is converted to a current sample using a linearized differential pair 14A. Each differential pair 14A has a transconductance set by its bias current, device dimensions and degeneration, and the ratio of the conversion coefficients (transconductances) can be accurately controlled by the proper use of known types of matching techniques. Therefore the ratios of the current samples can be accurately controlled (the exact absolute values are of no particular interest). The current samples are summed in the current mode by connecting the outputs of the linearized differential pairs 14A together at the summation junction or node 13. Also, the output current of the dither block 15 is added at the common summation node 13. The sum current is fed to the sources of the common gate input transistors 14E of the N−1 comparators 14B. The common gate configuration exhibits a low input impedance, which makes the summing of currents more accurate. In addition, the common gate transistors 14E isolate the input stage from the dynamic latches 14C of the output stage, and thus reduce the propagation of the kickback noise to the loop filter 12. The threshold generator 14D can be implemented with a resistor string (made of resistors or transistors), and is used to create the evenly distributed voltages between the positive and negative reference voltages needed to generate the threshold voltages in the multi-bit quantizer. Linearized differential pairs 14E are used to tap the appropriate threshold voltages and convert these voltages to currents. Again, the ratio of the conversion coefficients (transconductances) can be accurately controlled by proper use of matching techniques. Therefore these conversion coefficients have accurate relations to the conversion coefficients of the transconductors used to convert the sampled output voltages of the integrators. This accurate relationship is important, not the exact absolute values. The reference currents are fed to the sources of the common gate input transistors 14B of the N−1 comparators. The common gate transistors 14B isolate the resistive string of the threshold generator 14D from the dynamic latches 14C. and thus reduce the propagation of the kickback noise to the threshold generator 14D. The currents from the input stages that sense the outputs of the integrators 12A of the loop filter 12, as well as the currents from the input stages sensing the reference current thresholds, are summed at node 13A and fed to one of the latched regenerative loads 14C.

The feedback DAC 18 may be implemented with the same hardware as the integrators 12A to save circuit area and power. In addition, the noise is reduced. In opposition to the structure having a chain of integrators with distributed feedback, as shown in FIG. 3, each integrator 12A needs to support the digital-to-analog conversion, which makes the hardware more complicated. In the structure having a chain of integrators with the weighted forward summation only the first integrator needs to support the digital-to-analog conversion, and the other integrators can be conventional in construction.

The loading of the reference current buffer is also reduced, as the digital-to-analog conversion is performed only in the first integrator. Typically the current consumption of the reference buffer is of the same order as that of the modulator itself. These teachings reduce the area and current consumption of the entire analog-to-digital converter.

Improvements are also realized in the scaling of the capacitances and current consumption of the integrators 12A, as only the first integrator needs to support the digital-to-analog conversion, so the capacitances of the other integrators can be scaled more freely.

The summation and quantization preferably takes place in a short period of time at the end of the filtering phase, before the next digital-to-analog conversion. This places more demanding timing constraints on the settling of the integrators 12A, the settling of the summation block 13 and the decision making time of the quantizer 14. This results in a higher current consumption. However, the area and power requirements, and the speed of the summation and quantization in the embodiment of FIGS 1C and 7C is improved. For example, the delay in the loop filter (current mode summation is compact and fast), is improved when compared to using a separate summation block and a quantizer.

In general, the disclosed embodiments of these teachings beneficially reduce the generation of kickback noise, and furthermore reduce the input capacitance of the quantizer 14, thereby reducing the loading of the last amplifier in the loop filter 12.

The disclosed embodiments are readily implemented using standard integrated circuit techniques, they require only a modest amount of integrated circuit area, and their power consumption is relatively modest. These embodiments may further be implemented in digital switched capacitor (SC) or analog CMOS circuitry, and may be employed to advantage in, by example, multilevel quantization audio and receiver analog to digital converters.

Various modifications may be made to these teachings, such as by providing other types of dither signal generators and/or providing different types of reference signal generators (e.g., one relying on diode drops or even one using digital to analog converters).

In the illustrated embodiments the sampling and latching frequencies are application specific, and can range, for example, from a few kHz to about 100 MHz.

With regard to the delay between closing the input sampling switch and the rising edge of the latch signal, it should be noted that these events may occur simultaneously, as the input stage of the comparator and the latches are continuously tracking the input signal. If these events do occur simultaneously, the disturbances created by the input sampling switch may not affect the latching and vice versa, because of the physical separation (and the associated delay) of the sampling and latching circuits. If these events do not occur simultaneously, then a suitable delay may be at least about a nanosecond from the sampling clock to the latching clock so that the disturbances created by the sampling clock have been damped before the latching action occurs.

Thus, while these teachings have been particularly shown and described with respect to preferred embodiments thereof, it will be understood by those skilled in the art that changes in form and details may be made therein without departing from the scope and spirit of the invention.

What is claimed is:

1. An N-level quantizer circuit, said quantizer circuit having an analog input terminal and N−1 digital output terminals, comprising:
   a sampling circuit coupled to said input terminal for providing a sampled input voltage signal;
   at least one preamplifier stage for amplifying said sampled input voltage signal and providing a sampled input current signal;
   N−1 comparator stages each having an input coupled to an output of said at least one preamplifier stage, individual ones of said N−1 comparator stages operating to share said current signal and to compare said current signal to an associated one of N−1 reference current signals; and
   N−1 latches individual ones of which latch an output state of one of said N−1 comparators and having an output coupled to one of said N−1 digital output terminals of said quantizer circuit; wherein
      individual ones of said N−1 comparators are constructed using a plurality of common gate configured transistors for suppressing a feedback of noise from said N−1 latches to others of said comparators and to said input terminal of said quantizer circuit.

2. An N-level quantizer circuit as in claim 1, and further comprising a dither signal generator having an output coupled to said output of said at least one preamplifier stage.

3. An N-level quantizer circuit as in claim 1, and further comprising a threshold signal generator outputting said N−1 reference current signals.

4. An N-level quantizer circuit as in claim 3, wherein said threshold signal generator is comprised of a string of series coupled resistances connected between positive and negative reference voltages.

5. An N-level quantizer circuit as in claim 3, wherein said at least one preamplifier stage is comprised of a first differential transistor pair that converts said sampled input signal to a first current signal, wherein individual ones of said N−1 comparators comprise an input stage comprised of first common gate configured transistors operating to suppress the feedback of noise from said N−1 latches to said input terminal of said quantizer circuit, and further comprise a threshold input stage comprised of a second differential input transistor pair for converting an associated reference signal voltage to a second current, and further comprising second common gate configured transistors operating to suppress the feedback of noise from said N−1 latches to said reference signal generator, wherein said second current is coupled through said second common gate configured transistors and is summed at an output node of said comparator with said first current signal.

6. An N-level quantizer circuit as in claim 1, wherein a capacitive load seen at said input terminal of said quantizer is comprised of an input capacitance of said preamplifier stage plus the capacitance of said sampling circuit.

7. An N-level quantizer circuit as in claim 1, wherein said quantizer forms a part of a multi-bit sigma-delta modulator, and wherein said input terminal of said quantizer is coupled to an output of at least one integrator that forms a part of a loop filter.

8. An N-level quantizer circuit as in claim 1, wherein said at least one preamplifier stage is comprised of a plurality of preamplifier stages having outputs coupled together and providing weighted forward summation for sampled input current signals for summation at a common output node.

9. A multi-bit sigma-delta modulator, comprising:
   a loop filter having an input for coupling to an analog input signal and at least one integrator comprised of an amplifier having an output;
   an N-level quantizer circuit having an analog input terminal coupled to said output of said at least one loop filter amplifier and N−1 digital output terminals, said quantizer further comprising a sampling circuit coupled to said input terminal for sampling said output of said loop filter amplifier for providing a sampled input signal; at least one preamplifier stage outputting a first current signal representing said sampled input signal; N−1 comparator stages each having an input coupled to first current signal, individual ones of said N−1 comparator stages operating to equally share said first current signal and to compare a shared portion of said first current signal to an associated one of N−1 reference current signals; and N−1 dynamic latches individual ones of which latch an output state of one of said N−1 comparators and having an output coupled to one of said N−1 digital output terminals of said quantizer circuit; wherein individual ones of said N−1 comparators are constructed using a plurality of common gate configured transistors for suppressing a feedback of noise from said N−1 dynamic latches to others of said comparators and to said input terminal of said quantizer circuit; and a pseudorandom dither current signal generator having a dither current output signal coupled to said output of said at least one preamplifier stage where said dither current output signal is summed with said first current signal prior to being shared and compared with said associated one of said N−1 reference current signals.

10. A sigma-delta modulator as in claim 9, and further comprising a threshold signal generator for generating N−1 reference voltages, and wherein individual ones of said N−1 comparators are comprised of a threshold input stage comprised of a differential input transistor pair for converting an associated one of said N−1 reference voltages to one of said N−1 reference current signals.

11. A sigma-delta modulator as in claim 10, wherein said preamplifier stage is comprised of a first differential transistor pair that converts said sampled input signal to said first current signal, wherein individual ones of said N−1 comparators comprise an input stage comprised of first common gate configured transistors operating to suppress the feedback of noise from said N−1 latches to said input terminal of said quantizer circuit, and further comprise a threshold input stage comprised of a second differential input pair for converting an associated one of said N−1 reference voltages to said associated one of N−1 reference current signals, and further comprising second common gate configured transistors operating to suppress the feedback of noise from said N−1 latches to said reference signal generator, wherein said associated one of N−1 reference current signals is coupled through said second common gate configured transistors and is summed at an output node of said comparator with said first current signal.

12. A sigma-delta modulator as in claim 10, wherein said threshold signal generator is comprised of a string of series coupled resistances connected between positive and negative reference voltages.

13. A sigma-delta modulator as in claim 10, wherein said threshold signal generator is comprised of a transconductor feeding a plurality of scaled current mirrors for outputting a plurality of scaled reference currents.

14. A sigma-delta modulator as in claim 9, wherein said at least one preamplifier stage is comprised of a plurality of preamplifier stages having weighted forward summation for amplifying said sampled input voltage signals and for providing amplified sampled input current signals for summation at a common output node.

15. A sigma-delta modulator as in claim 9, wherein capacitive load seen at said input terminal of said quantizer is comprised of an input capacitance of said preamplifier stage plus the capacitance of a capacitance that comprises a portion of said sampling circuit.

16. A method for operating an N-level quantizer, comprising steps of:

sampling an input signal to provide a sampled input voltage signal;

preamplifying said sampled input signal and outputting a first current signal representing a preamplified sampled input signal;

adding a dither current signal to said first current signal to generate a dithered first current signal;

coupling said dithered first current signal to an input terminal of individual ones of N−1 comparator stages;

dividing said dithered first current signal equally amongst said N−1 comparator stages;

operating individual ones of said N−1 comparator stages to compare a divided portion of said dithered first current signal to an associated one of N−1 reference current signals; and latching an output of each of said N−1 comparator stages with a dynamic latch; wherein individual ones of said N−1 comparators are constructed using a plurality of common gate configured transistors for suppressing a feedback of noise generated by said step of latching to others of said comparators and to an input terminal of said N-level quantizer.

17. A method as in claim 16, wherein the step of adding the dither current signal to said first current signal comprises a step of generating the dither signal to have pseudorandom fluctuations in amplitude, and a magnitude that varies inversely to the magnitude of the input signal.

18. A method for operating an N-level quantizer, comprising steps of:

sampling a plurality of input signals to provide a plurality of sampled input voltage signals;

operating a plurality of preamplifiers for preamplifying the sampled input voltage signals and outputting first current signals representing preamplified sampled input voltage signals;

summing the first current signals by connecting together the outputs of the preamplifiers;

adding a dither current signal to the sum of the first current signals to generate a dithered sum of the first current signals;

coupling the dithered sum of the first current signals to an input terminals of individual ones of N−1 comparator stages, where the dithered sum of the first current signals is equally divided between the N−1 comparator stages;

operating individual ones of the N−1 comparator stages to compare a divided portion of the dithered sum of the first current signals to an associated one of N−1 reference current signals; and latching an output of each of the N−1 comparator stages with a dynamic latch.

19. A method as in claim 18, wherein said individual ones of the N−1 comparators are constructed using a plurality of common gate configured transistors for suppressing a feedback of noise generated by the step of latching to others of the comparators, as well as to an input terminal of the N-level quantizer.

20. A method as in claim 18, wherein the step of generating the dither current signal includes a step of generating the dither signal to have pseudorandom fluctuations in amplitude, and a magnitude that varies inversely to the magnitude of the input signal.

* * * * *